(12) United States Patent
Okuda

(10) Patent No.: US 6,229,836 B1
(45) Date of Patent: May 8, 2001

(54) SEMICONDUCTOR LASER AND A METHOD OF MANUFACTURING THEREFOR

(75) Inventor: Tetsuro Okuda, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/328,504

(22) Filed: Jun. 9, 1999

(30) Foreign Application Priority Data

Jun. 10, 1998 (JP) .................................... 10-162294

(51) Int. Cl.⁷ .................................. H01S 3/19; H01L 21/20
(52) U.S. Cl. .................................. 372/48; 372/43; 372/45; 372/46; 372/50; 437/51; 437/129; 437/131
(58) Field of Search .................................. 372/43, 45, 46, 372/47, 48, 50; 437/26, 20, 36, 35, 51, 129, 131, 167, 155, 147

(56) References Cited

U.S. PATENT DOCUMENTS

| | | | |
|---|---|---|---|
| 4,774,554 | * | 9/1988 | Dentai et al. ..................... 156/606 X |
| 4,796,268 | * | 1/1989 | Schairer ................................ 372/46 |
| 4,908,831 | * | 3/1990 | Yoshida et al. ........................ 372/46 |
| 5,153,890 | * | 10/1992 | Bona et al. ............................. 372/48 |
| 5,208,821 | * | 5/1993 | Berger et al. .......................... 372/48 |
| 5,982,798 | * | 11/1999 | Okuda ................................... 372/46 |
| 6,028,875 | * | 2/2000 | Knight et al. .......................... 372/46 |

FOREIGN PATENT DOCUMENTS

| | | | |
|---|---|---|---|
| 62-128589 | 6/1987 | (JP) | .................................... 372/48 X |
| 63-169085 | 7/1988 | (JP) | .................................... 372/48 X |
| 5-299771 | 11/1993 | (JP) | .................................... 372/48 X |
| 6-204598 | 7/1994 | (JP) | .................................... 372/48 X |
| 6-283800 | 10/1994 | (JP) | .................................... 372/48 X |
| 10-93190 | 4/1998 | (JP) | .................................... 372/48 X |

\* cited by examiner

Primary Examiner—Brian Healy
(74) Attorney, Agent, or Firm—Sughrue, Mion, Zinn, Macpeak & Seas, PLLC

(57) ABSTRACT

A dopant such as Si is introduced to recombination layers 2. The Si concentration is about $1 \times 10^{17}$ to $5 \times 10^{18}$ cm$^{-3}$. Thus, a carrier lifetime in the recombination layers 2 may be reduced to relatively increase a leakage current flowing the recombination layers 2 while relatively reducing a leakage current flowing channels 3.

28 Claims, 10 Drawing Sheets

SEMICONDUCTOR LASER AND A METHOD OF MANUFACTURING THEREFOR

BACKGROUND OF THE INVENTION

1. Field of the Invention

This invention relates to a buried type of semiconductor laser and in particular to a semiconductor laser having excellent elevated-temperature and high-power properties.

2. Description of the Related Art

Recently, a high-power semiconductor laser has been needed for an optical CATV, a light source for EDFA excitation or an OTDR.

For meeting such needs, for example, ELECTRONICS LETTERS, VOL.18, NO.22, 1982 has suggested a DC-PBH (double channel Planar buried hetero-structure) laser, where a leakage current is recombined in recombination layers 2 having the same composition as an active layer 1, formed on both sides of the active layer as shown in FIG. 11, to minimize turn-on of a block layer due to a p-n junction for attempting to improve its elevated-temperature and high-power properties.

However, there are still needs for higher level of elevated-temperature and high-power properties, and thus extensive studies have been conducted for meeting the needs.

For example, JP-A 6-283800 has disclosed a technique that a concentration of a block layer and a channel width are designed to optimize distribution between a leakage current flowing a p-n junction and a current flowing a recombination layer for improving elevated-temperature and high-power properties of a DC-PBH (double channel Planar buried hetero-structure) laser. In the laser, a concentration of a p-type dopant in a p-type current block layer 4 is elevated and a channel width is narrowed to increase a current flowing a recombination layer 2 as shown in FIG. 2, while relatively reducing a current flowing a channel 3. Thus, a semiconductor laser has been suggested, in which a total leakage current at a high-power operation may be reduced to improve its high-power properties.

The technique described in the above publication, however, has the following problems.

First, it may not provide adequate high-power properties. In general, Zn is used as a dopant for a p-type current block layer. As the concentration of the dopant Zn increases, more Zn atoms are diffused into an active layer from a p-type current block layer during forming the p-type current block layer, resulting in increase of internal loss in the active layer. It may cause reduction in an efficiency and deterioration in high-power properties of the laser.

Secondly, an effect of increase of the dopant concentration in the p-type current block layer may be substantially saturated about at $1 \times 10^{18}$ cm$^{-3}$ because increase of the dopant concentration in the block layer may increase a leakage current flowing the recombination layer while saturating a carrier-recombination rate in the recombination layer. In other words, there is a certain limit for improvement by increasing the dopant concentration.

Thirdly, a laser may become less reliable. As described above, an elevated dopant concentration in the p-type current block layer may increase contamination of the active layer with the dopant, leading to making the laser less reliable.

SUMMARY OF THE INVENTION

A semiconductor laser of this invention has been developed for solving the above problems. Specifically, an object of this invention is to provide a higher-power semiconductor laser by improving recombination of carrier in a recombination layer in a DC-PBH type of semiconductor laser. Another object of this invention is to provide a higher-power and highly reliable semiconductor laser without increasing the dopant concentration in the p-type current block layer.

This invention provides a DC-PBH (double channel Planar buried hetero-structure) type of semiconductor laser comprising current block layers and recombination layers on both sides of an active layer, the recombination layers containing a dopant.

This invention also provides a DC-PBH type of semiconductor laser comprising current block layers and recombination layers on both sides of an active layer, the recombination layers containing lattice defects.

The configurations and effects of the DC-PBH types of semiconductor lasers will be described with reference to the drawings.

A semiconductor laser of this invention is characterized in that a dopant or lattice defects (damages in a crystal) are introduced to recombination layers in a DC-PBH type of semiconductor laser.

FIG. 1 shows an example of a semiconductor laser according to this invention. The semiconductor laser comprises a pair of channels 3 on both sides of an active layer 1 and, outside of the pair of channels 3, recombination layers 2, which comprise a dopant and/or lattice defects.

FIG. 2 schematically shows a leakage current flowing a block layer in a DC-PBH type of semiconductor laser. For the DC-PBH type of semiconductor laser, the leakage current may be divided into two types, depending on their paths. One is a leakage current flowing the channel 3 via an n-InP type current block layer 5 and a p-InP type current block layer 4, and the other is a leakage current flowing the recombination layer 2 from the p-InP type current block layer 4. The former current may cause potential reduction in the p-InP type current block layer 4 and thus may induce turn-on of a pnpn thyristor configured in the block layer, which is a particularly significant problem, FIG. 3 shows calculation results of optical-output dependency of these leakage-current components, with two-dimensional optical-device simulator. As the optical output increases, the leakage currents increase. In particular, a usual DC-PBH type of semiconductor laser exhibits a feature that the leakage current flowing the channel sharply increases while the leakage current flowing the recombination layer more slowly increases. Therefore, it may be possible to improve high-power properties for a laser by designing the block layers so that the leakage current flowing the recombination layer is relatively increased while relatively reducing the leakage current flowing the channel.

On the basis of such a concept, the semiconductor laser described in JP-A 6-283800 is provided, in which the dopant concentration in the p-type current block layer is increased and the channel is narrower to relatively increase the leakage current flowing the recombination layer while relatively reducing the leakage current flowing the channel. As described above, the leakage current flowing the channel may be reduced and high-power properties may be improved to some degree, but there are various problems such as a certain limit in the improvement.

On the other hand, the semiconductor laser of this invention increases a carrier-recombination rate in the recombination layer to increase the leakage current flowing the recombination layer while reducing the leakage current flowing the channel. In a conventional semiconductor laser, the recombination layer has the same composition as that of the active layer, and thus a carrier lifetime in the recombination layer is relatively longer, resulting in a lower recombination rate. Therefore, even if the dopant concentration in the p-type current block layer is increased, it does not contribute to significant increase in the leakage current flowing the recombination layer. In the light of the situation, in this invention, a dopant or lattice defects are introduced to provide different properties from the active layer. The dopant or lattice defects may play a role of recombination centers to reduce a carrier lifetime in the recombination layer, leading to increase in a recombination rate and thus increase in the leakage current flowing the recombination layer.

Thus, in this invention, a dopant or lattice defects are introduced to a recombination layer to which they have not been conventionally introduced, to permit increase of the leakage current flowing the recombination layer which has been limited with a carrier-recombination rate in the recombination layer. As a result, it may reduce the leakage current flowing a channel and even the total leakage current at a high power.

A semiconductor laser according to this invention may eliminate necessity of elevating a dopant concentration in a block layer near the active layer and thus does not cause efficiency reduction due to an elevated dopant concentration in the block layer and deterioration in reliability.

This invention also provides a method of manufacturing a DC-PBH (double channel Planar buried hetero-structure) type of semiconductor laser, comprising the steps of:

forming a semiconductor layer having a predetermined bandgap on a semiconductor substrate, on which a cladding layer is then formed;

forming a pair of grooves deeper than the semiconductor layer to divide the semiconductor layer into an active layer sandwiched by the pair of grooves and recombination layers outside the pair of grooves;

removing the cladding layer on the recombination layers to expose at least parts of the recombination layers;

introducing a dopant into the recombination layers; and burying a semiconductor material in the grooves to form a current block layers.

This invention also provides a method of manufacturing a DC-PBH (double channel Planar buried hetero-structure) type of semiconductor laser, comprising the steps of:

forming a semiconductor layer having a predetermined bandgap on a semiconductor substrate, on which a cladding layer is then formed;

forming a pair of grooves deeper than the semiconductor layer to divide the semiconductor layer into an active layer sandwiched by the pair of grooves and recombination layers outside the pair of grooves;

removing the cladding layer on the recombination layers by dry etching to expose at least parts of the recombination layers; and burying a semiconductor material in the grooves to form current block layers.

In the above manufacturing process, the cladding layer is removed by dry etching to expose at least parts of the recombination layers. Dry etching can impart lattice defects into the recombination layer. The above manufacturing process may provide a DC-PBH type of semiconductor laser in which lattice defects have been imparted to the recombination layers, by means of relatively simple steps. Both dopant and lattice defects may be introduced to the recombination layers.

This invention also provides a method of manufacturing a DC-PBH type of semiconductor laser, comprising separately growing an active layer and recombination layers on predetermined regions of an semiconductor substrate, a dopant being introduced to the growing recombination layers.

This invention also provides a method of manufacturing a DC-PBH type of semiconductor laser, comprising the steps of:

growing an active layer on a predetermined region of a semiconductor substrate, using a mask; and growing recombination layers comprising a dopant on other predetermined regions of the semiconductor substrate, using a mask, where these steps may be conducted in any order.

In the above manufacturing process, the active layer and the recombination layers are separately formed to allow doping to be employed for introducing a dopant and thus the dopant concentration may be precisely controlled.

According to a DC-PBH type of semiconductor laser of this invention, introducing a dopant or lattice defects in a recombination layer accelerates carrier-recombination in the recombination layer and reduces a leakage current flowing a channel. Thus, the laser may have improved elevated-temperature and high-power properties without reduction in its efficiency or reliability. This invention may accelerate carrier-recombination in a recombination layer and significantly increase a current flowing the recombination layer. This invention may reduce a channel leakage current much more than a conventional procedure based on optimization in design of a current block layer or a channel width.

In a DC-PBH type of semiconductor laser of this invention, a dopant or lattice defects are imparted to a recombination layer. Therefore, it may be manufactured by simple steps. In particular, since the lattice defects may be imparted by, for example, dry etching, without adding steps.

In a method of manufacturing a DC-PBH type of semiconductor laser of this invention, a DC-PBH type of semiconductor laser in which a dopant or lattice defects are imparted in a recombination layer may be manufactured by relatively simple steps. Both dopant and lattice defects may be imparted to the recombination layer.

Separately forming an active layer and recombination layers may allow doping to be employed for introducing a dopant, and thus a dopant concentration may be precisely controlled.

DETAILED DESCRIPTION OF THE PREFERRED EMBODIMENTS

In this invention, a dopant concentration is preferably $1\times10^{17}$ to $5\times10^{18}$ cm$^{-3}$, more preferably $5\times10^{17}$ to $2\times10^{18}$ cm$^{-3}$. Such a concentration of dopant may effectively increase a carrier-recombination rate in recombination layers 2, without deterioration in an efficiency or reliability of a laser. The dopant may be, for example, Si or Zn.

The dopant may be introduced by doping during growing the recombination layers 2 or by ion implantation. Doping may allow a dopant concentration to be precisely controlled, while ion implantation may allow a dopant and lattice defects to be simultaneously introduced to the recombination layers.

The recombination layers in this invention preferably have a multiquantum well structure, which may further improve a carrier-recombination rate in the recombination layers 2.

The recombination layers may be dry-etched during its manufacturing process. Dry etching can impart lattice defects which may become recombination centers, to improve a recombination rate.

A semiconductor substrate in this invention may be an n- or p-conduction type.

Preferabe embodiments of this invention will be specifically described.

First Embodiment

Figure 1:
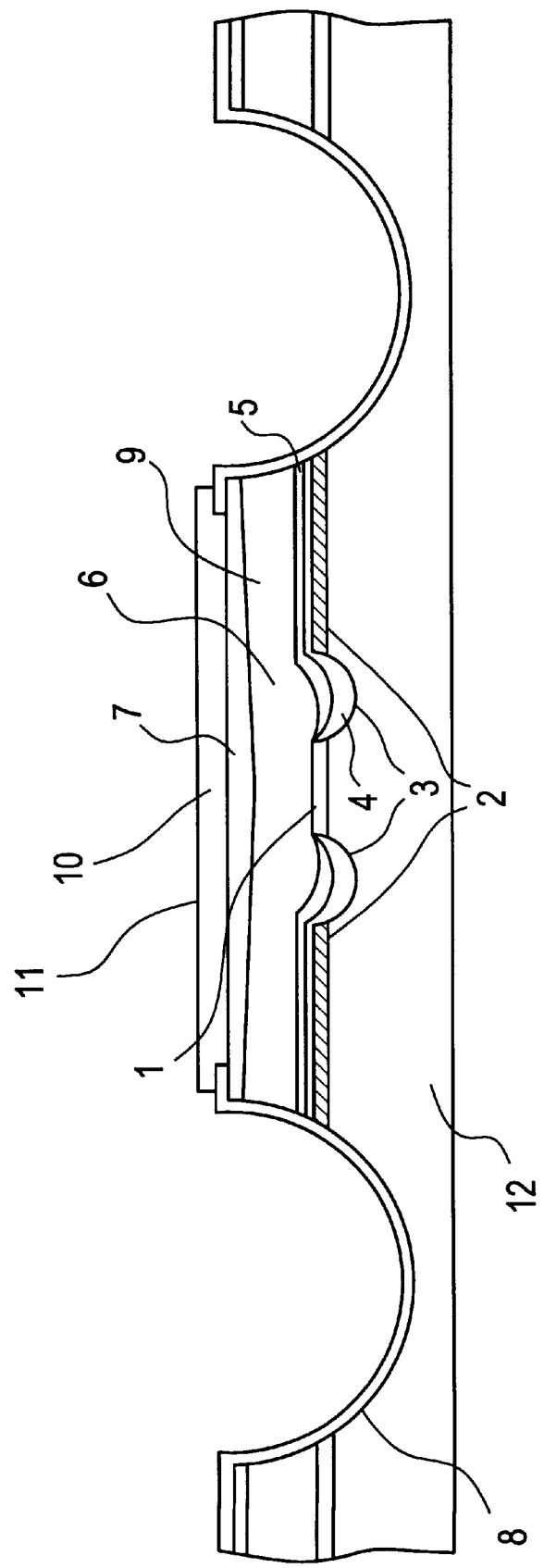
FIG. 1 illustrates a structure of a semiconductor laser according to this invention.

An embodiment of a DC-PBH type of semiconductor laser according to this invention will be described with reference to FIG. 1. The DC-PBH type of semiconductor laser in FIG. 1 comprises an n-InP substrate 12 on which an active layer 1 is formed, and on both sides of the active layer, there are formed current block layers 4 and 5 as well as recombination layers 2. The recombination layers 2 comprise a dopant. On both sides of the active layer 1 there are a pair of channels 3 in which a p-type (p-InP) and an n-type (n-InP) current block layer are buried. On the surface of the active layer 1 there are formed an SiO$_2$ insulating film 9, a p-InGaAs cap layer 7 and an electrode 10, and an electrode mesa 11 is separated by a pair of electrode separating grooves 8.

Figure 2:
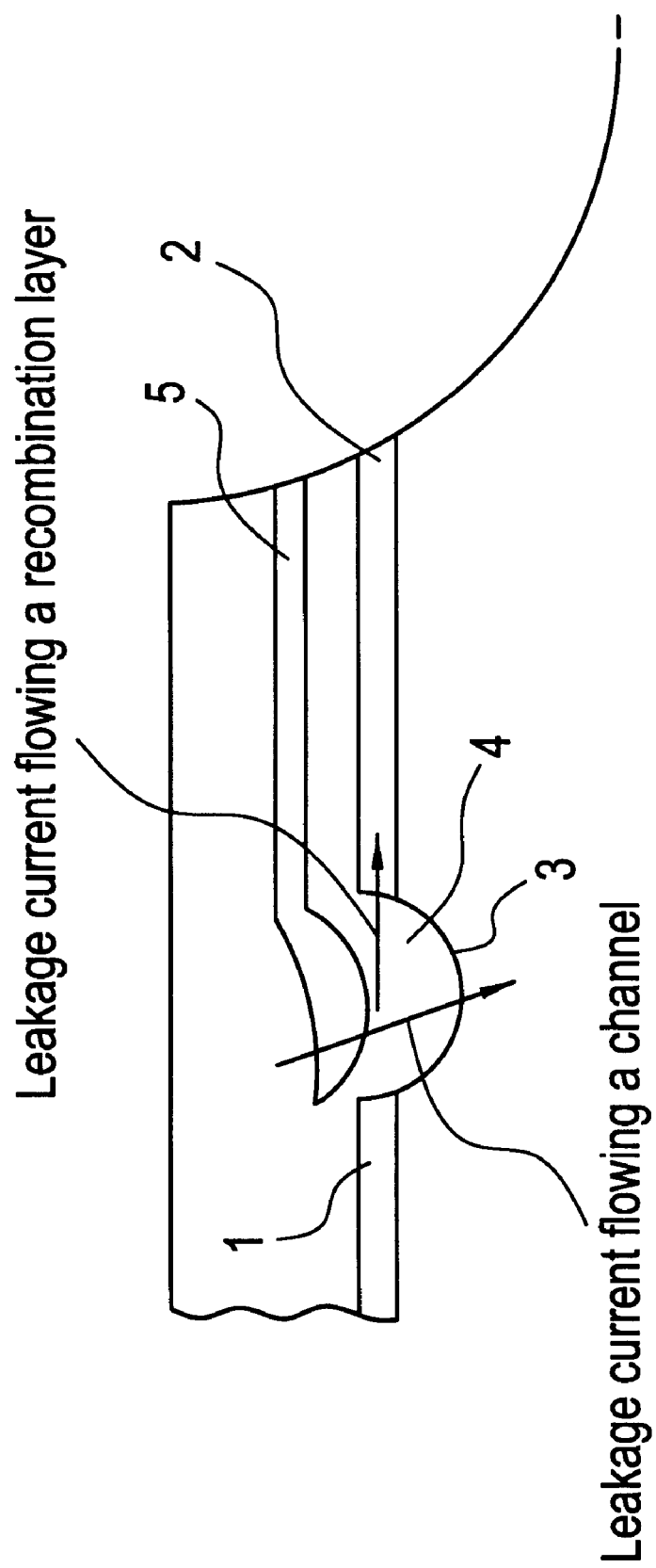
FIG. 2 illustrates a principle for a semiconductor laser according to this invention.
Figure 3:
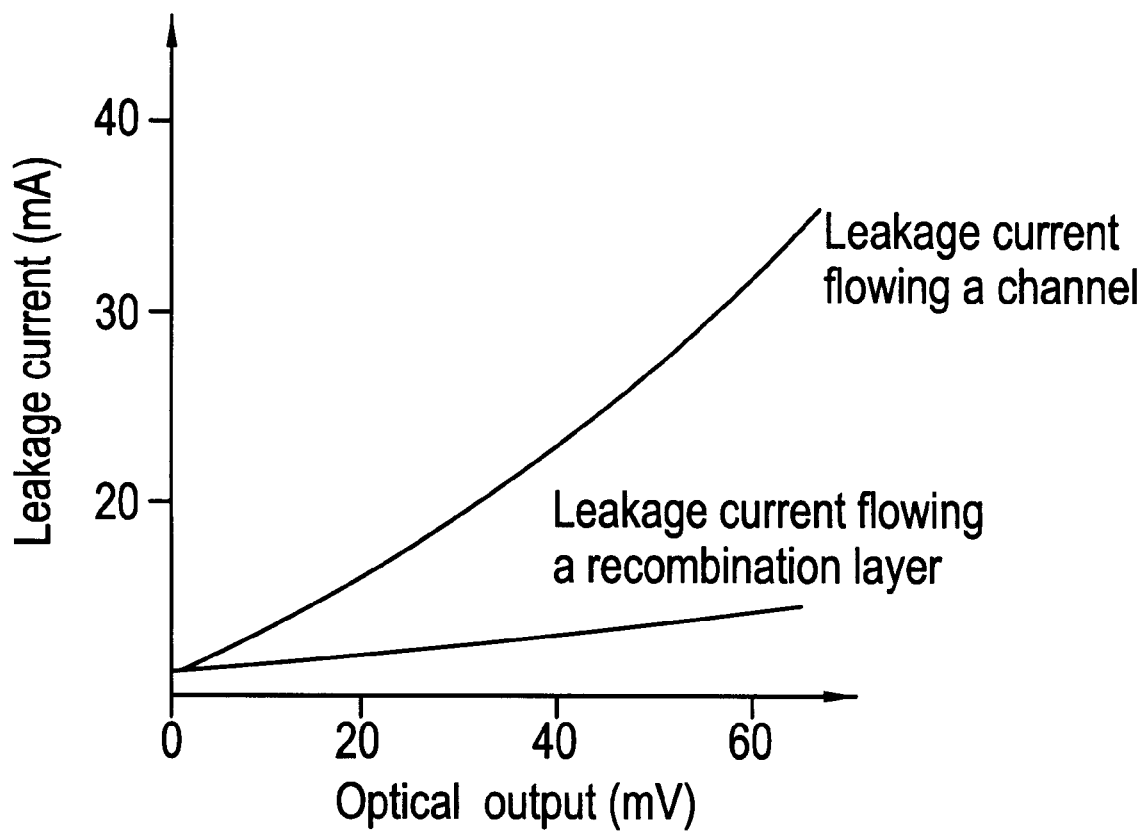
FIG. 3 illustrates a principle for a semiconductor laser according to this invention.

In the prior art, the recombination layers 2 and the active layer 1 are formed in a single process, and thus their compositions and layer structures are identical. On the other hand, in this invention, a dopant or lattice defects are imparted to the recombination layers 2, to improve a carrier-recombination rate in the recombination layers 2. It increases a leakage current flowing the recombination layers shown in FIG. 2, while effectively reducing a leakage current flowing the channels, i.e., a leakage current flowing the current block layers buried in the channels.

Second Embodiment

An embodiment of a method of manufacturing a DC-PBH type of semiconductor laser of this invention will be described with reference to FIG. 5.

Figure 5A:
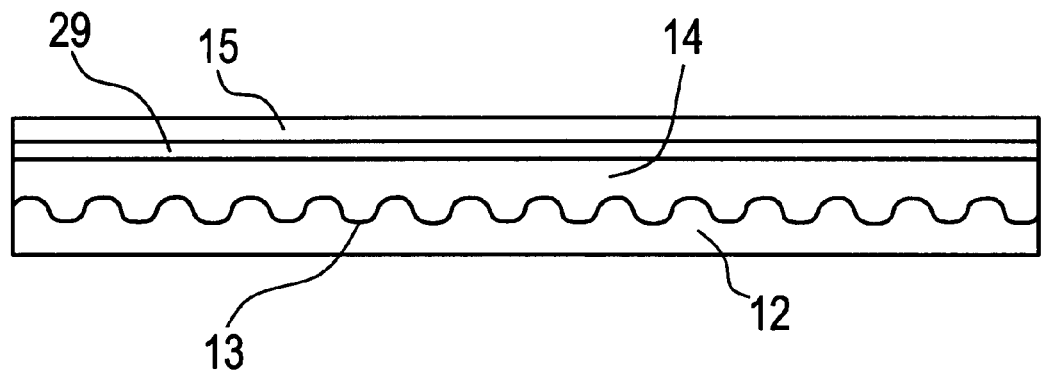
FIGS. 5(a)–(c) shows a method of this invention.

As shown in FIG. 5(a), on a semiconductor substrate is formed a semiconductor layer 29 having a predetermined bandgap, on which a cladding layer 15 is then formed.

Figure 5B:
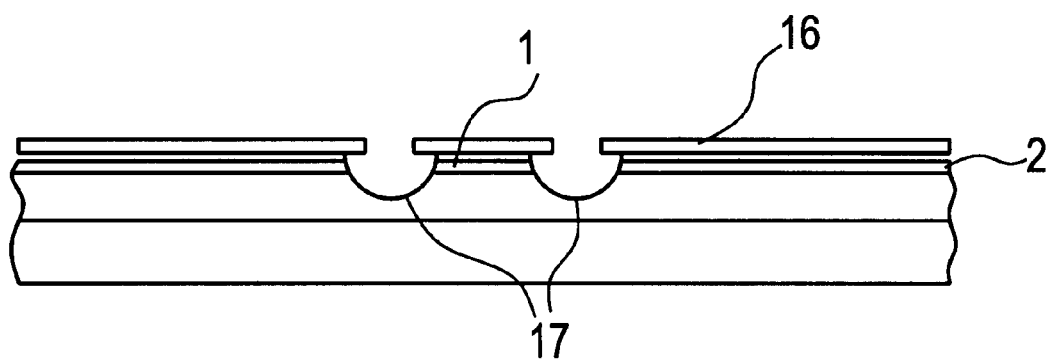

Then, on the substrate are formed a pair of grooves (grooves for burying growth) deeper than the semiconductor layer 29 (FIG. 5(b)). The grooves may be formed by, for example, etching using a photoresist 16 as a mask, as shown in FIG. 5(b). The grooves divide the semiconductor layer 29 into an active layer 1 between the pair of grooves and recombination layers 2 outside of the pair of grooves.

Figure 5C:
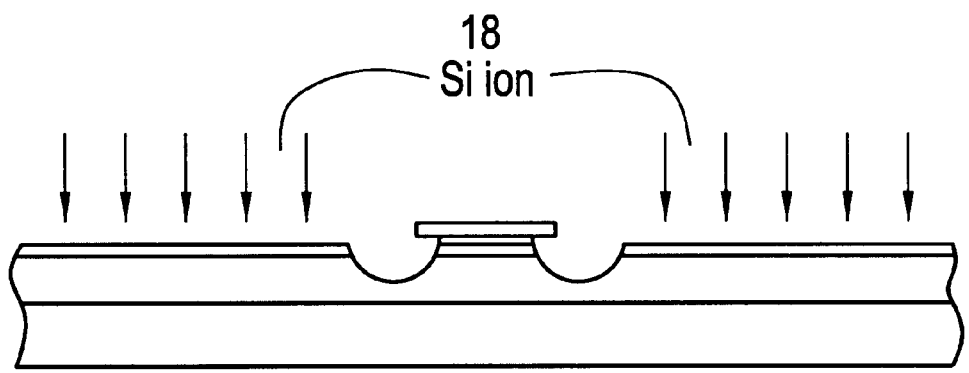

Then, the cladding layers 15 on the recombination layers 2 are removed to expose at least parts of the recombination layers 2 (FIG. 5(c)). Preferably, the cladding layers 15 are removed by, for example, dry etching because dry etching may impart lattice defects to the recombination layers 2 to provide recombination centers.

Then, a dopant is introduced to the recombination layers 2. The dopant may be introduced by ion implantation from the exposed parts in the recombination layers 2. Ion implantation is preferable because lattice defects are simultaneously introduced during ion implantation to further provide recombination centers.

Then, a semiconductor material is buried into the grooves to form current block layers, on which a burying layer and a cap layer and then an electrode (not shown) are formed to give a laser.

Third Embodiment

Another embodiment of a method of manufacturing a DC-PBH type of semiconductor laser of this invention will be described with reference to FIGS. 8 and 9.

In this method, an active layer and recombination layers are separately grown on a semiconductor substrate, and a dopant is introduced during growing the recombination layers.

Figure 8A:
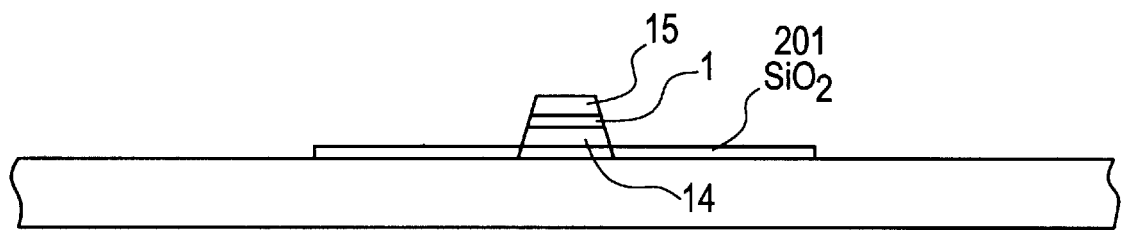
FIGS. 8(a)–(c) shows a method of this invention.

On a predetermined region of a semiconductor substrate is grown a semiconductor multilayer comprising an active layer 1, using an SiO$_2$ film 201 as a mask (FIG. 8(a)).

Figure 8B:
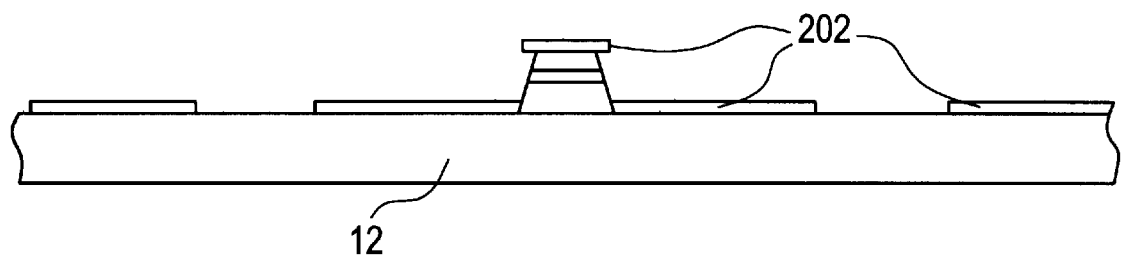

Then, SiO$_2$ films 202 are formed on the semiconductor substrate (FIG. 8(b)). Using the SiO$_2$ films 202 as a mask, semiconductor multilayers comprising a recombination layer 2 are grown (FIG. 8(c)). During growing the recombination layer, a dopant is introduced by, for example, doping.

Figure 9A:
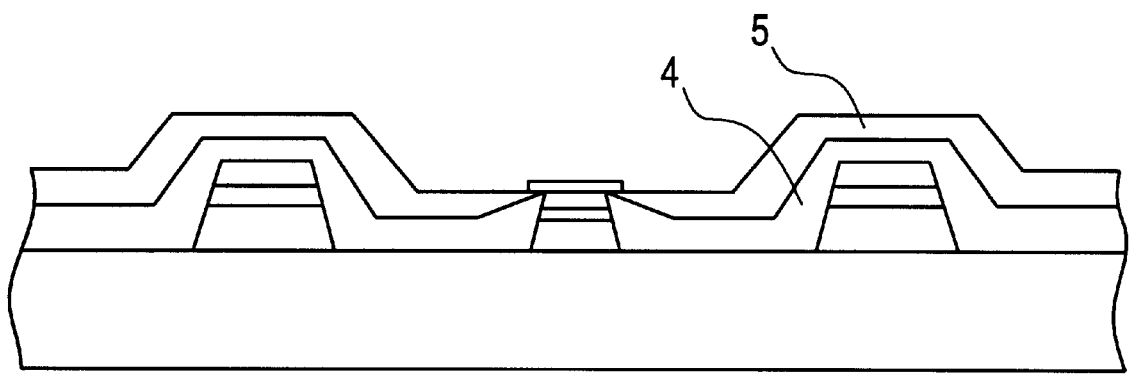
FIGS. 9(a)–(b) shows a method of this invention.
Figure 9B:
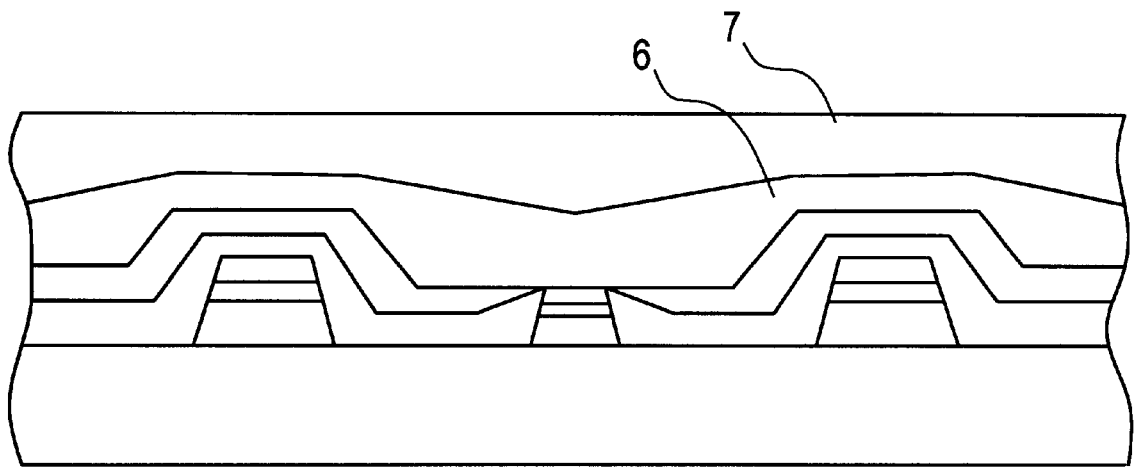

Electrode block layers 4, 5 and a burying layer 6, and then an electrode (not shown) are formed to give a semiconductor laser (FIG. 9(a) and (b)).

In this embodiment, the recombination layer may be a strained multiple quantum well layer. A strain factor or film thickness may be sufficient to give a supercritical film thickness and thus to reduce crystal strain, leading to introduction of lattice defects into the crystal. In such a manner, a recombination rate in the recombination layers may be improved.

The recombination layers may be grown at a growth temperature lower or higher than that for usual growing, to increase a dopant in the crystal. In general, an active layer is grown at a growth temperature of 600° C. to 700° C. in metal organic vapor phase epitaxy (hereinafter, referred to as MOVPE). A lower growth temperature from 550 to 600° C. may accelerate incorporation of a dopant. Furthermore, growing at 650 to 800° C. may increase a dopant in the recombination layers to give a desired effect. In any case, defects may be increased and a carrier lifetime in the recombination layers may be reduced, compared with a crystal grown at an optimal temperature.

In addition, the recombination layers may be grown with a different material from that for the active layer, to introduce a dopant in the crystal. For example, an organic arsenic material such as triethylarsenic may be used in place of arsine as an As material commonly used in MOVPE. Thus, carbon which is generated during decomposition may be incorporated into the crystal as a dopant, to provide recombination centers for improving a recombination rate.

This invention will be detailed with the following examples.

EXAMPLE 1

This example will be described with reference to the drawings. As shown in FIG. 5(a), on an n-InP substrate 12 was formed a diffraction grating with a period of 202.7 nm by an interference exposure technique, on which were grown an n-InGaAsP optical guide layer 14, a semiconductor layer 29 having a predetermined bandgap consisting of a multiple quantum well and a p-InP cladding layer 15 by MOVPE. Then, as shown in FIG. 5(b), a photoresist 16 is applied. After patterning by usual exposure, grooves 17 as mesas for burying growth to be channels were formed by etching, which divide the semiconductor layer 29 into an active layer 1 and recombination layers 2.

Leaving the photoresist just on the active layer, the photoresists on the recombination layers 2 were removed and then the p-InP cladding layers on the recombination layers 2 were etched off. Thus, the recombination layers were exposed in the wafer surface.

Then, as shown in FIG. 5(c), Si ions 18 were implanted on the wafer, to introduce an n-type dopant to the regions to be the recombination layers while introducing some damage to the multiple quantum well layer due to ion implantation, leading to reduction of a carrier lifetime within the recombination layers. The Si concentration was $1 \times 10^{18}$ cm$^{-3}$.

Figure 6:
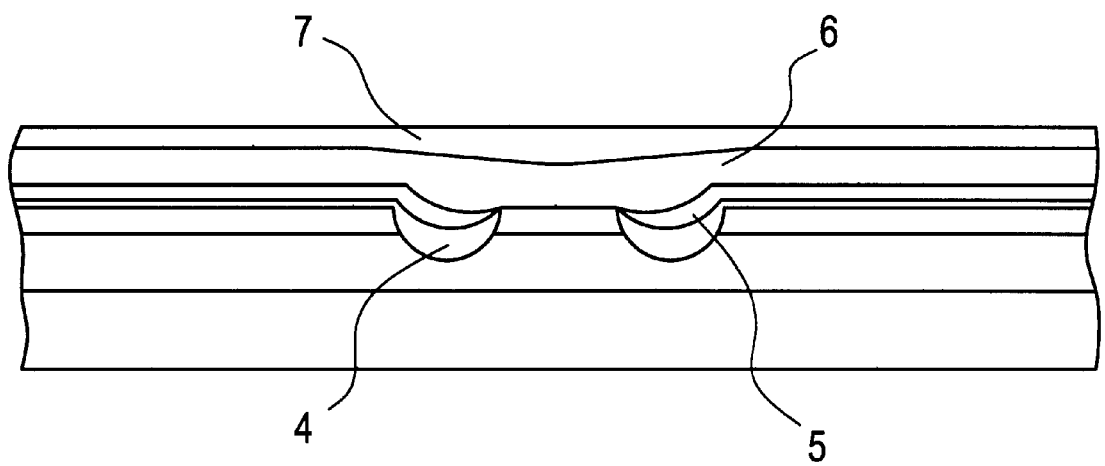
FIG. 6 shows a method of this invention.

Then, the photoresists were removed. A DC-PBH buried structure was formed by usual LPE growth as shown in FIG. 6. An electrode was formed by a usual electrode formation process, and then a bar was cut out from the wafer by cleavage. After applying coating with reflectances of 1% and 75% for the front and the rear surfaces, respectively, a device was cut out from the bar, to give a semiconductor laser.

Figure 4:
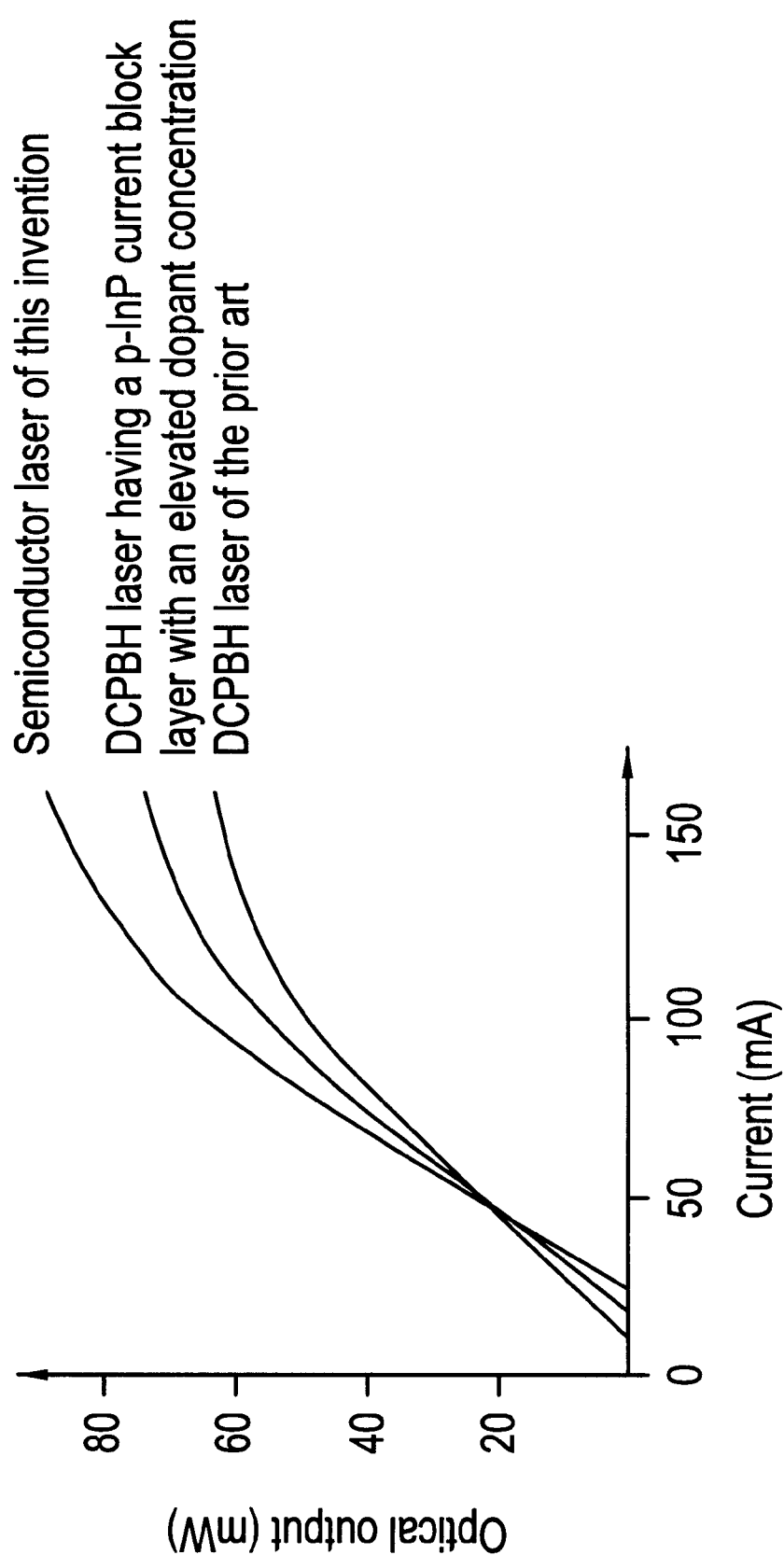
FIG. 4 illustrates a principle for a semiconductor laser according to this invention.

FIG. 4 shows current-optical properties for the semiconductor laser manufactured as described in this example and a conventional semiconductor laser. In the conventional semiconductor laser, the threshold is lower while output saturation is notably observed due to an effect of a leakage current in a high-power region. On the other hand, the semiconductor laser of this invention exhibits good properties substantially without saturation until the optical output region over 80 mW.

EXAMPLE 2

Figure 7:
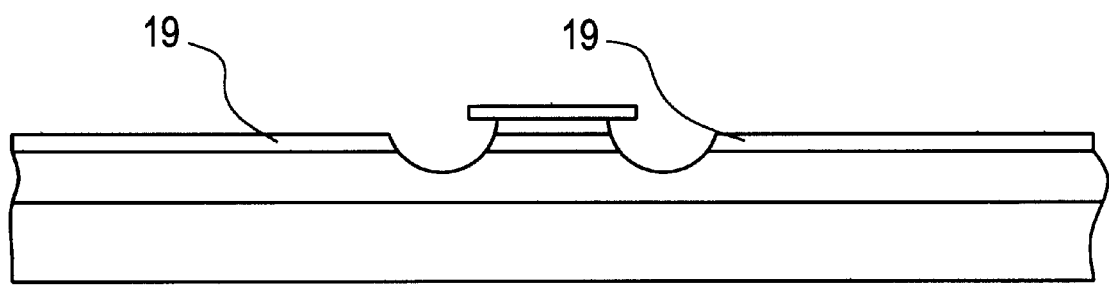
FIG. 7 shows a method of this invention.

A laser was prepared as described in Example 1, except that Zn was diffused in the recombination layers 2 by a diffusion method, rather than Si implantation (FIG. 7). The Zn concentration was $1 \times 10^{18}$ cm$^{-3}$. Forming the Zn diffusion regions 19 as recombination layers causes reduction of a carrier lifetime within the recombination layers as was in Example 1. Furthermore, the wafer surface was damaged during the diffusion step, which may further reduce the carrier lifetime.

EXAMPLE 3

A laser was prepared as described in Example 1, except that dry etching was conducted during etching the p-InP cladding layer for exposing the multiple quantum well layer in the wafer surface, without Si-ion implantation. Thus, removal of the InP layer and impartition of lattice defects in the multiple quantum well layer simultaneously occurred for improving the recombination rate.

EXAMPLE 4

Figure 8C:
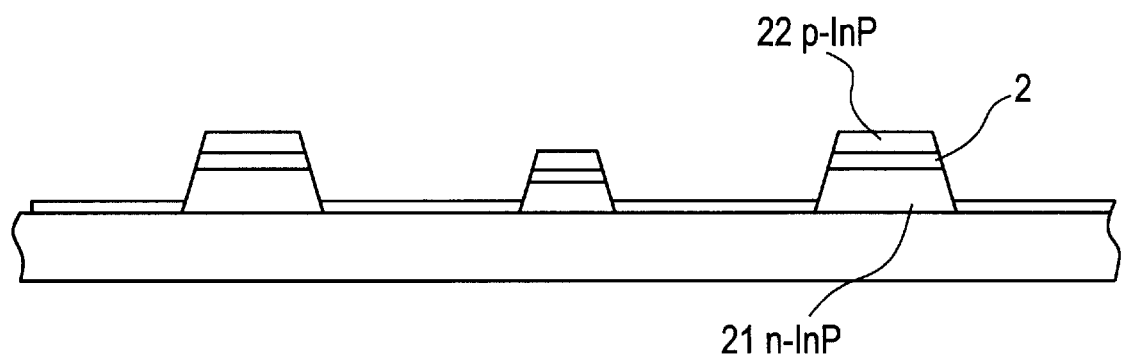

This example will be described with reference to FIGS. 8 and 9. As shown in FIG. 8(a), SiO$_2$ film 20 was deposited on an n-InP substrate having a diffraction grating, and a stripe with an opening size of 1.5 μm was formed by photolithography. Then, in the opening were formed an n-InGaAsP optical guide layer 14, an active layer 1 and a p-InP cladding layer 15 by MOVPE selective growth. Then, SiO$_2$ was removed and then SiO$_2$ was again deposited, after which a SiO$_2$ stripe was formed just on the active layer and on both sides of the active layer, with an opening size of 3 μm, as shown in FIG. 8(b). Then, again by MOVPE selective growth, an n-InP layer 21, a recombination layer 2 and a p-InP layer 22 were grown as shown in FIG. 8(c), while Si was introduced to the recombination layers 2 by doping. The dopant concentration was $2 \times 10^{18}$ cm$^{-3}$. In this example, the multiple quantum well layer to which an n-type dopant was introduced plays a role as a recombination layer. Then, leaving the SiO$_2$ film just on the active layer, the SiO$_2$ on both sides of the recombination layer was removed and then an p-InP block layer 4 and an n-InP block layer 5 were grown. After removing the SiO$_2$ film on the active layer, a p-InP burying layer 6 and a p-InGaAsP cap layer 7 were grown by MOVPE.

An electrode was formed by a usual electrode formation process, and then a bar was cut out from the wafer by cleavage. After applying coating, a device was cut out from the bar, to give a semiconductor laser (FIG. 9).

According to the process described in this example, the recombination layers and the active layer are separately formed, and therefore a dopant may be introduced by doping. Thus, the dopant concentration may be precisely controlled.

EXAMPLE 5

Figure 10A:
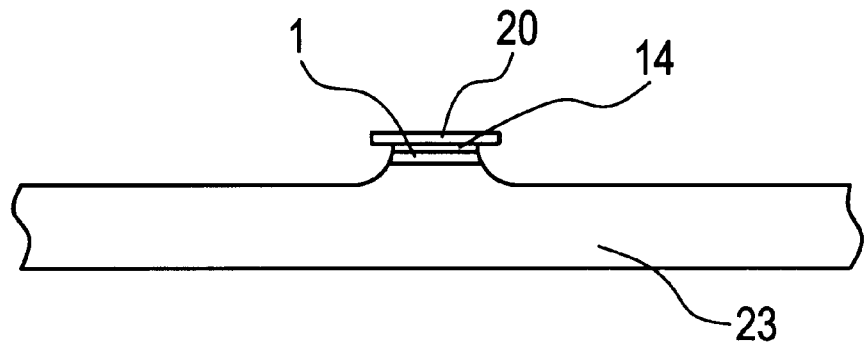
FIGS. 10(a)–(c) shows a method of this invention.
Figure 10B:
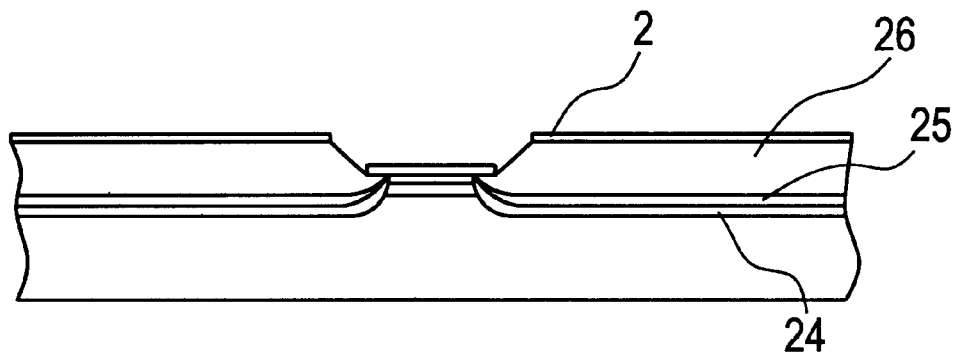
Figure 10C:
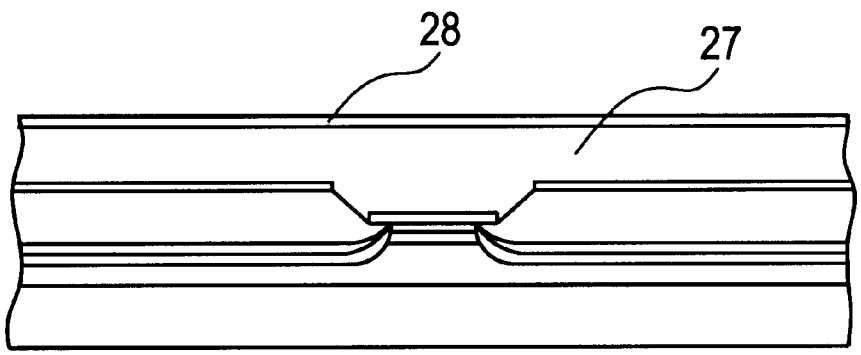
Figure 11:
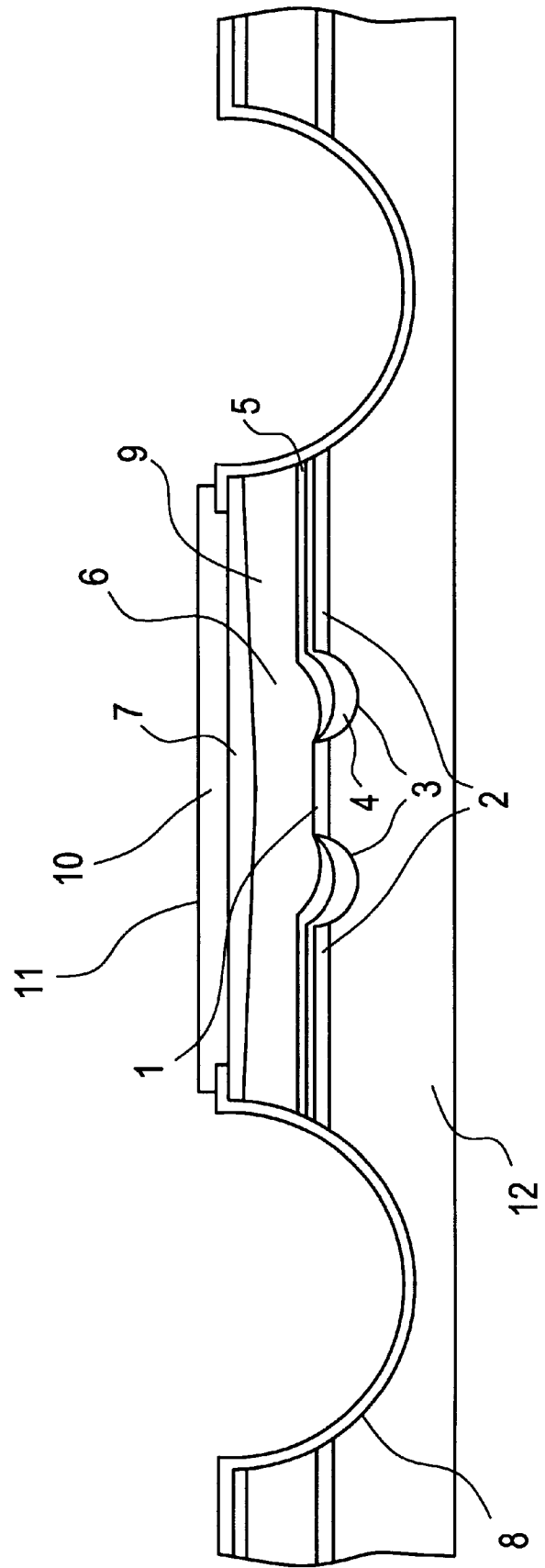
FIG. 11 illustrates a structure of a semiconductor laser according to the prior art.

This example will be described with reference to the drawings. As shown in FIG. 10(a), on a p-InP substrate 23 were an active layer 1 consisting of a multiple quantum well and an n-InGaAsP optical guide 14. On the wafer was formed a diffraction grating, and then n-InP was grown for burying. Over all the surface was formed a SiO$_2$ film, and then a stripe with a width of 4 μm was formed by photolithography and etching. Then, as shown in FIG. 10(b), an n-InP block layer 24 and a p-InP block layer 26 were grown by MOVPE selective growth and Si as an n-type dopant was introduced to form recombination layers 2, during which Si was introduced to the recombination layers 2 by doping. The dopant concentration was $2 \times 10^{18}$ cm$^{-3}$. Then, the SiO$_2$ film was removed and an n-InP burying layer 27 and an n-InGaAsP cap layer 28 were grown.

The process described in this example may reduce the number of growth steps, compared with Example 4, which may simplify the process.

In the examples described above, a multiple quantum well layer is used as a recombination layer, but it will be of course apparent that a recombination layer based on a bulk crystal may be similarly effective.

What is claimed is:

1. A DC-PBH (double channel Planar buried heterostructure) type of semiconductor laser comprising current block layers and recombination layers on both sides of an active layer, the recombination layers containing a dopant.

2. A DC-PBH type of semiconductor laser as claimed in claim 1 where the dopant concentration is $1 \times 10^{17}$ to $5 \times 10^{18}$ cm$^{-3}$.

3. A DC-PBH type of semiconductor laser as claimed in claim 1 where the dopant is selected from Si and Zn.

4. A DC-PBH type of semiconductor laser as claimed in claim 1 where the dopant is introduced by ion implantation.

5. A DC-PBH type of semiconductor laser as claimed in claim 1 where the recombination layers have a multiple quantum well structure.

6. A DC-PBH type of semiconductor laser as claimed in claim 1, comprising a p-type substrate.

7. A DC-PBH (double channel Planar buried heterostructure) type of semiconductor laser comprising current block layers and recombination layers on both sides of an active layer, the recombination layers containing lattice defects.

8. A DC-PBH type of semiconductor laser as claimed in claim 7 where the recombination layers have a multiple quantum well structure.

9. A DC-PBH type of semiconductor laser as claimed in claim 7, comprising a p-type substrate.

10. A method of manufacturing a DC-PBH (double channel Planar buried hetero-structure) type of semiconductor laser, comprising the steps of:

forming a semiconductor layer having a predetermined bandgap on a semiconductor substrate, on which a cladding layer is then formed;

forming a pair of grooves deeper than the semiconductor layer to divide the semiconductor layer into an active layer sandwiched by the pair of grooves and recombination layers outside the pair of grooves;

removing the cladding layer on the recombination layers to expose at least parts of the recombination layers;

introducing a dopant into the recombination layers; and burying a semiconductor material in the grooves to form a current block layers.

11. The method of claim 10, where in the step of removing the cladding layer to expose at least parts of the recombination layers, the cladding layer is removed by dry etching.

12. The method of claim 10, where the dopant concentration is $1 \times 10^{17}$ to $5 \times 10^{18}$ cm$^{-3}$.

13. The method of claim 10, where the dopant is selected from Si and Zn.

14. The method of claim 10, where the dopant is introduced by ion implantation.

15. The method of claim 10, where the semiconductor substrate is a p-type substrate.

16. A method of manufacturing a DC-PBH (double channel Planar buried hetero-structure) type of semiconductor laser, comprising separately growing an active layer and recombination layers on predetermined regions of an semiconductor substrate, a dopant being introduced to the growing recombination layers.

17. The method of claim 16, where an organic arsenic material is used in growing the recombination layers.

18. The method of claim 16, where the dopant concentration is $1 \times 10^{17}$ to $5 \times 10^{18}$ cm$^{-3}$.

19. The method of claim 16, where the dopant is selected from Si and Zn.

20. The method of claim 16, where the semiconductor substrate is a p-type substrate.

21. A method of manufacturing a DC-PBH (double channel Planar buried hetero-structure) type of semiconductor laser, comprising the steps of:

growing an active layer on a predetermined region of a semiconductor substrate, using a mask; and growing recombination layers comprising a dopant on other predetermined regions of the semiconductor substrate, using a mask.

22. The method of claim 21, where an organic arsenic material is used in growing the recombination layers.

23. The method of claim 21, where the dopant concentration is $1 \times 10^{17}$ to $5 \times 10^{18}$ cm$^{-3}$.

24. The method of claim 21, where the dopant is selected from Si and Zn.

25. The method of claim 21, where the semiconductor substrate is a p-type substrate.

26. A method of manufacturing a DC-PBH (double channel Planar buried hetero-structure) type of semiconductor laser, comprising the steps of:

forming a semiconductor layer having a predetermined bandgap on a semiconductor substrate, on which a cladding layer is then formed;

forming a pair of grooves deeper than the semiconductor layer to divide the semiconductor layer into an active layer sandwiched by the pair of grooves and recombination layers outside the pair of grooves;

removing the cladding layer on the recombination layers by dry etching to expose at least parts of the recombination layers; and burying a semiconductor material in the grooves to form current block layers.

27. The method of claim 26 where the recombination layers have a multiple quantum well structure.

28. The method of claim 26, where the semiconductor substrate is a p-type substrate.

* * * * *